(12) United States Patent
Haddad et al.

(10) Patent No.: US 8,865,507 B2
(45) Date of Patent: Oct. 21, 2014

(54) INTEGRATED VISIBLE AND INFRARED IMAGER DEVICES AND ASSOCIATED METHODS

(71) Applicant: SiOnyx, Inc., Beverly, MA (US)

(72) Inventors: Homayoon Haddad, Beaverton, OR (US); Leonard Forbes, Corvallis, OR (US)

(73) Assignee: SiOnyx, Inc., Beverly, MA (US)

(*) Notice: Subject to any disclaimer, the term of this patent is extended or adjusted under 35 U.S.C. 154(b) by 18 days.

(21) Appl. No.: 13/712,865

(22) Filed: Dec. 12, 2012

(65) Prior Publication Data

US 2013/0207214 A1 Aug. 15, 2013

Related U.S. Application Data

(63) Continuation-in-part of application No. 13/652,336, filed on Oct. 15, 2012, which is a continuation-in-part of application No. 13/621,737, filed on Sep. 17, 2012.

(60) Provisional application No. 61/535,631, filed on Sep. 16, 2011, provisional application No. 61/546,896, filed on Oct. 13, 2011, provisional application No. 61/569,690, filed on Dec. 12, 2011.

(51) Int. Cl.
*H01L 21/00* (2006.01)
*H01L 31/0236* (2006.01)
*H01L 31/18* (2006.01)
*H01L 27/146* (2006.01)

(52) U.S. Cl.
CPC ...... *H01L 31/0236* (2013.01); *H01L 31/02363* (2013.01); *Y02E 10/50* (2013.01); *H01L 31/186* (2013.01); *H01L 27/146* (2013.01)

USPC .................. 438/67; 438/125; 257/E21.505

(58) Field of Classification Search
None
See application file for complete search history.

(56) References Cited

U.S. PATENT DOCUMENTS 3,487,223 A 12/1969 St. John
4,277,793 A 7/1981 Webb
(Continued)

FOREIGN PATENT DOCUMENTS

AU 3666484 6/1985
GB 2030766 4/1980
(Continued)

OTHER PUBLICATIONS

Berger, Michael; Moth Eyes Inspire Self-Cleaning Antireflection Nanotechnology Coatings; 2008; 3 pages; Network LLC.

(Continued)

*Primary Examiner* — Cheung Lee
(74) *Attorney, Agent, or Firm* — Thorpe North & Western LLP

(57) ABSTRACT

Semiconductor devices having three dimensional (3D) architectures and methods form making such devices are provided. In one aspect, for example, a method for making a semiconductor device can include forming a device layer on a front side of a semiconductor layer that is substantially defect free, bonding a carrier substrate to the device layer, processing the semiconductor layer on a back side opposite the device layer to form a processed surface, and bonding a smart substrate to the processed surface. In some aspects, the method can also include removing the carrier substrate from the semiconductor layer to expose the device layer.

28 Claims, 11 Drawing Sheets

(56) References Cited

U.S. PATENT DOCUMENTS

| | | | |
|---|---|---|---|
| 4,419,533 A | 12/1983 | Czubatyj et al. |
| 4,493,942 A | 1/1985 | Sheng et al. |
| 4,514,582 A | 4/1985 | Tiedje et al. |
| 4,536,608 A | 8/1985 | Sheng et al. |
| 4,663,188 A | 5/1987 | Kane |
| 4,829,013 A | 5/1989 | Yamazaki |
| 5,080,725 A | 1/1992 | Green et al. |
| 5,081,049 A | 1/1992 | Green et al. |
| 5,100,478 A | 3/1992 | Kawabata |
| 5,114,876 A | 5/1992 | Weiner |
| 5,164,324 A | 11/1992 | Russell et al. |
| 5,322,988 A | 6/1994 | Russell et al. |
| 5,346,850 A | 9/1994 | Kaschmitter et al. |
| 5,373,182 A | 12/1994 | Norton |
| 5,597,621 A | 1/1997 | Hummel et al. |
| 5,714,404 A | 2/1998 | Mititsky et al. |
| 5,731,213 A | 3/1998 | Ono |
| 5,792,280 A | 8/1998 | Ruby et al. |
| 6,147,297 A | 11/2000 | Wettling et al. |
| 6,379,979 B1 | 4/2002 | Connolly |
| 6,580,053 B1 | 6/2003 | Voutsas |
| 6,583,936 B1 | 6/2003 | Kaminsky et al. |
| 6,667,528 B2 | 12/2003 | Cohen et al. |
| 6,759,262 B2 | 7/2004 | Theil et al. |
| 6,800,541 B2 | 10/2004 | Okumura |
| 7,057,256 B2 | 6/2006 | Carey, III et al. |
| 7,091,411 B2 | 8/2006 | Falk et al. |
| 7,109,517 B2 | 9/2006 | Zaidi |
| 7,132,724 B1 | 11/2006 | Merrill |
| 7,235,812 B2 | 6/2007 | Chu et al. |
| 7,247,527 B2 | 7/2007 | Shimomura et al. |
| 7,314,832 B2 | 1/2008 | Kountz et al. |
| 7,354,792 B2 | 4/2008 | Carey, III et al. |
| 7,390,689 B2 | 6/2008 | Mazur et al. |
| 7,442,629 B2 | 10/2008 | Mazur et al. |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,745,901 B1 | 6/2010 | McCaffrey et al. |
| 7,781,856 B2 | 8/2010 | Mazur et al. |
| 7,816,220 B2 | 10/2010 | Mazur et al. |
| 7,847,253 B2 | 12/2010 | Carey et al. |
| 7,884,439 B2 | 2/2011 | Mazur et al. |
| 7,884,446 B2 | 2/2011 | Mazur et al. |
| 8,030,726 B2 | 10/2011 | Sumi |
| 8,058,615 B2 | 11/2011 | McCaffrey |
| 8,207,051 B2 | 6/2012 | Sickler et al. |
| 8,476,681 B2 | 7/2013 | Haddad et al. |
| 2003/0029495 A1 | 2/2003 | Mazur et al. |
| 2004/0222187 A1 | 11/2004 | Lin |
| 2005/0127401 A1 | 6/2005 | Mazur et al. |
| 2005/0227390 A1 | 10/2005 | Shtein et al. |
| 2006/0011955 A1 | 1/2006 | Baggenstoss |
| 2006/0079062 A1 | 4/2006 | Mazur et al. |
| 2006/0118781 A1 | 6/2006 | Rhodes |
| 2006/0231914 A1 | 10/2006 | Carey, III et al. |
| 2007/0145505 A1 | 6/2007 | Kim et al. |
| 2008/0026550 A1 | 1/2008 | Werner et al. |
| 2008/0044943 A1 | 2/2008 | Mazur et al. |
| 2008/0076240 A1 | 3/2008 | Veschtti et al. |
| 2008/0099804 A1 | 5/2008 | Venezia |
| 2008/0178932 A1 | 7/2008 | Den Boer et al. |
| 2008/0191310 A1* | 8/2008 | Wu et al. ............ 257/508 |
| 2008/0258604 A1 | 10/2008 | Mazur et al. |
| 2009/0065051 A1 | 3/2009 | Chan et al. |
| 2009/0142879 A1 | 6/2009 | Isaka et al. |
| 2009/0160983 A1 | 6/2009 | Lenchenkov |
| 2009/0194671 A1 | 8/2009 | Nozaki et al. |
| 2009/0200586 A1 | 8/2009 | Mao et al. |
| 2009/0213883 A1 | 8/2009 | Mazur et al. |
| 2010/0037952 A1 | 2/2010 | Lin |
| 2010/0052088 A1 | 3/2010 | Carey |
| 2010/0055887 A1 | 3/2010 | Piwczyk |
| 2010/0072349 A1 | 3/2010 | Veeder |
| 2010/0074396 A1 | 3/2010 | Schmand et al. |
| 2010/0097609 A1 | 4/2010 | Jaeger et al. |
| 2010/0143744 A1 | 6/2010 | Gupta |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0264473 A1 | 10/2010 | Adkisson et al. |
| 2010/0290668 A1 | 11/2010 | Friedman et al. |
| 2010/0300505 A1 | 12/2010 | Chen |
| 2011/0073976 A1 | 3/2011 | Vaillant |
| 2011/0220971 A1 | 9/2011 | Hadda |
| 2011/0227138 A1 | 9/2011 | Hadda |
| 2011/0266644 A1 | 11/2011 | Yamamura et al. |
| 2011/0303999 A1 | 12/2011 | Sakamoto et al. |
| 2012/0024363 A1 | 2/2012 | Dimer et al. |
| 2012/0024364 A1 | 2/2012 | Carey, III et al. |
| 2012/0111396 A1 | 5/2012 | Saylor et al. |
| 2012/0171804 A1 | 7/2012 | Moslehi et al. |
| 2012/0313204 A1 | 12/2012 | Haddad et al. |
| 2012/0313205 A1 | 12/2012 | Haddad et al. |
| 2013/0082343 A1 | 4/2013 | Fudaba et al. |

FOREIGN PATENT DOCUMENTS

| | | |
|---|---|---|
| JP | 63116421 | 5/1988 |
| JP | 2152226 | 6/1990 |
| JP | 07/173484 | 7/1995 |
| JP | 9148594 | 6/1997 |
| JP | 9298308 | 11/1997 |
| JP | 11097724 | 4/1999 |
| JP | 2001/89478 | 7/2001 |
| JP | 2001/339057 | 12/2001 |
| JP | 2008/187003 | 8/2008 |
| JP | 2009/021479 | 1/2009 |
| KR | 2001/0061058 | 4/2001 |
| KR | 2010/0118864 | 11/2010 |
| WO | WO 2006/086014 | 8/2006 |
| WO | WO 2009/100023 | 8/2009 |
| WO | WO 2011/035188 | 3/2011 |

OTHER PUBLICATIONS

Boden, S.A. et al.; Nanoimprinting for Antireflective Moth-Eye Surfaces; 4 pages; 2008.

Bogue: "From bolometers to beetles: the development of the thermal imaging sensors;" sensor Review; 2007; pp. 278-281; Emerald Group Publishing Limited (ISSN 0260-2288).

Buttgen, B.; "Demodulation Pixel Based on Static Drift Fields"; IEEE Transactions on Electron Devices, vol. 53, No. 11, Nov. 2006.

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS; 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Carey, III; "Femtosecond-laser Microstructuring of Silicon for Novel Optoelectronic Devices"; Harvard University, Jul. 2004; (Thesis).

Carey, J.E. PhD Thesis Harvard University, pp. 86-116, 2004.

Chen, Q. et al.; Broadband moth-eye antireflection coatings fabricated by low-cost nanoimprinting; Applied Physics Letters 94; pp. 263118-1-263118-3; 2009; American Institute of Physics.

Chien et al, "Pulse Width Effect in Ultrafast Laser Processing of Materials," Applied Physics A, 2005, 1257-1263, 81, Springer Berlin, Heidelberg, Germany.

(56) References Cited

OTHER PUBLICATIONS

Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.

Crouch et al., "Comparison of Structure and Properties of Femtosecond and Nanosecond Laser-Structured Silicon" Appl. Phys. Left., 2004, 84,1850-1852.

Crouch et al., "Infrared Absorption by Sulfur-Doped Silicon Formed by Femtosecond Laser Irradiation", Appl. Phys. A, 2004, 79, 1635-1641.

Despeisse, et al.; "Thin Film Silicon Solar Cell on Highly Textured Substrates for High Conversion Efficiency"; 2004.

Dewan, Rahul et al.; Light Trapping in Thin-Film Silicon Solar Cells with Submicron Surface Texture; Optics Express; vol. 17, No. 25; Dec. 7, 2009; Optical Society of America.

Dobie, et al.; "Minimization of reflected light in photovoltaic modules"; Mar. 1, 2009.

Dobrzanski, L.A. et al.; Laser Surface Treatment of Multicrystalline Silicon for Enhancing Optical Properties; Journal of Materials Processing Technology; p. 291-296; 2007; Elsevier B.V.

Dolgaev et al., "Formation of Conical Microstructures Upon Laser Evaporation of Solids", Appl. Phys. A, 2001, 73, 177-181.

Duerinckx, et al.; "Optical Path Length Enhancement for >13% Screenprinted Thin Film Silicon Solar Cells"; 2006.

Dulinski, Wojciech; "Tests of a backside illuminated monolithic CMOS pixel sensor in an HPD set-up"; Nuclear Instruments and Methods in Physics Research Section A; Apr. 1, 2005.

Forbes; "Texturing, reflectivity, diffuse scattering and light trapping in silicon solar cells"; 2012.

Fowlkes et al., "Surface Microstructuring and Long-Range Ordering of Silicon Nanoparticles", Appl. Phys. Lett., 2002, 80 (20), 3799-3801.

Gjessing, J. et al.; 2D back-side diffraction grating for impored light trapping in thin silicon solar cells; Optics Express; vol. 18, No. 6; pp. 5481-5495; Mar. 15, 2010; Optical Society of America.

Goetzberger, et al.; "Solar Energy Materials & Solar Cells"; vol. 92 (2008) pp. 1570-1578.

Haug, et al.; "Light Trapping effects in thin film silicon solar cells"; 2009.

Her et al., "Microstructuring of Silicon with Femtosecond Laser Pulses," Applied Physics Letters, 1998, 1673-1675, vol. 73, No. 12, American Institute of Physics.

Her et al., "Novel Conical Microstructures Created in Silicon With Femtosecond Laser Pulses", CLEO 1998, 511-512, San Francisco, CA.

Her, et al., "Femtosecond laser-induced formation of spikes on silicon," Applied Physics A, 2000, 70, 383-385.

Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.

Huang, et al.; "Microstructured silicon photodetector"; Applied Physics Letters 89, 033506; 2006 American Institute of Physics; 2000.

Hüpkes, J. et al.; Light Scattering and Trapping in Different Thin Film Photovoltaic Devices; 24$^{th}$ European Photovoltaic Solar Energy Conference, Hamburg, Germany (Sep. 21-25, 2009); pp. 2766-2769.

Joy, T. et al.; Development of a Production-Ready, Back-Illuminated CMOS Image Sensor with Small Pixels; Electron Devices Meeting; pp. 1007-1010; 2007; IEEE.

Kim et al.; "Strong Sub-Band-Gap Infrared Absorption in Silicon Supersaturated with Sulfur"; 2006 Appl. Phys. Lett. 88, 241902-1-241902-3.

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al.; X-ray Imaging Systems for NDT and General Applications; 2002; Fraunhofer Institute for Nondestructive Testing; Saarbrucken and Dresden, Germany; 18 pages.

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA; 2005.

Lin, A. et al.; Optimization of Random Diffraction Gratings in Thin-Film Solar Cells Using Genetic Algorithms; 2007; 1 page; SSEL Annual Report; 2007.

Madzhaov, et al.; "Light trapping in thin-firm silicon solar cells for superstrate and substrate configuration" Abstract #1614, 218$^{th}$ ECS Meeting © 2010 the Electrochemical Society.

Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.

Matsuno, Shigeru et al.; Advanced Technologies for High Efficiency Photovoltaic Systems; Mitsubishi Electric Advance; vol. 122; pp. 17-19; Jun. 2008.

Moloney, A.M. et al.; Novel Black Silicon PIN Photodiodes; 8 pages; Jan. 25, 2006; SPIE.

Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.

Nayak et al, "Semiconductor Laesr Crystallization of a-Si:H," SPIE Digital Library, 2003, 277-380, vol. 4977, Bellingham, Washington. 2003.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak et al.; "Ultra-Laser-Assisted Chemical Restructuring of Silicon and Germanium Surfaces," 2007, Applied surface Science, 253, 680-6583, Elsevier B.V.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Oden, et al.; "Optical and Infrared Detection Using Microcantilevers;" SPIE Digital Library on Oct. 13, 2010; vol. 2744; 10 pages.

Pain, Bedabrata; "A Back-Illuminated Megapixel CMOS Image Sensor"; http://hdl.handle.net/2014/39312; May 1, 2005.

Pain, Bedabrata; Backside Illumination Technology for SOI-CMOS Image Sensors; 2009 IISW Symposium on Backside Illumination of Solid-State Image Sensors, Bergen Norway; Jun. 25, 2009; pp. 1-23.

Payne, D.N.R. et al.; Characterization of Experimental Textured ZnO:AI Films for Thin Film Solar Cell Applications and Comparison with Commercial and Plasmonic Alternatives; Photovoltaic Specialists Conference (PVSC); pp. 1560-1564; 2010; IEEE.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Pedraza et al., "Surface Nanostructuring of Silicon", Appl. Phys. A, 2003, 77, 277-284.

Russell, et al.; "Nanosecond Eximer Laser Processing for Novel Microelectronic Fabrication"; Nanosecond Excimer Laser Processing; 6 pages; 1989.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Sarnet et al.; "Femtosecond laser for black silicon and photovoltaic cells"; Feb. 21, 2008, Proc. Of SPIE; vol. 6881; pp. 1-15.

Senoussaoui, N. et al.; Thin-Film Solar Cells with Periodic Grating Coupler; Thin Solid Films; pp. 397-401; 2003; Elsevier B.V.

(56) References Cited

OTHER PUBLICATIONS

Shen et al., "Formation of Regular Arrays of Silicon Micorspikes by Femotsecond Laser Irradiation Through a Mask", Appl. Phys. Left., 82, 1715-1717 (2003).

Solar Energy Research Institute, "Basic Photovoltaic Principles and Methods," Van Nostrand Reinhold Co., NY 1984, pp. 45-47 and 138-142.

Szlufcik, et al.; "Simple integral screenprinting process for selective emitter polycrystalline silicon solar cells"; Appl. Phys. Left. 59 (13); Sep. 23, 1991.

Tabbal et al., "Formation of Single Crystal Sulfur Supersaturated Silicon Based Junctions by Pulsed Laser Melting". 2007, J. Vac. Sci. Technol. B25(6), 1847-1852.

Tower, et al.; "Large format Backside illuminated CCD Imager for Space Surveillance"; IEEE Transactions on electron Devices, vol. 50, No. 1, Jan. 2003.

Tull; "Femtosecond Laser Ablation of Silicon: Nanoparticles, Doping and Photovotaics"; Harvard University, Jun. 2007 (Thesis).

Winderbaum, S. et al.; Reactive ion etching (RIE) as a method for texturing polycrystalline silicon solar cells; Solar Energy Materials and Solar Cells; 1997; pp. 239-248; Elsevier Science B.V.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Wu, et al, "Near-Unity Below-Band-Gap Absorption by Microstructured Silicon," 2001, Applied Physics Letters, 1850-1852, vol. 78, No. 13, American Institute of Physics.

Xu, et al.; "Infrared detection using thermally isolated silicon diode"; Sensors and actuators A, vol. 36 (1993) pp. 209-217.

Yablonovitch, et al.; "Intensity Enhancement in Textured Optical Sheets for Solar Cells"; © 1982 IEEE.

Yamamoto, K. et al.; NIR Sensitivity Enhancement by Laser Treatment for Si Detectors; Nuclear Instruments and Methods in Physics Research A; pp. 520-523; Mar. 31, 2010; Elsevier.

Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.

Younkin et al., "Infrared Absorption by Conical Silicon Microstructures Made in a Variety of Background Gases Using Femtosecond-Laser Pulses", J. Appl. Phys., 93, 2626-2629 (2003).

Younkin, "Surface Studies and Microstructure Fabrication Using Femtosecond Laser Pulses," Thesis presented to the Division of Engineering & Applied sciences at Harvard University (Aug. 2001).

Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

Zaidi, S.H. et al.; Diffraction Grating Structures in Solar Cells; Photovoltaic Specialists Conference, 2000; 4 pages; Sep. 2000; IEEE.

\* cited by examiner

INTEGRATED VISIBLE AND INFRARED IMAGER DEVICES AND ASSOCIATED METHODS

PRIORITY DATA

This application is a continuation-in-part of U.S. patent application Ser. No. 13/652,336, filed on Oct. 15, 2012, which is a continuation-in-part of U.S. patent application Ser. No. 13/621,737 filed on Sep. 17, 2012, which claims the benefit of U.S. Provisional Patent Application Ser. No. 61/535,631, filed on Sep. 16, 2011, both of which are incorporated herein by reference. The Ser. No. 13/652,336 application also claims the benefit of U.S. Provisional Patent Application Ser. No. 61/546,896, filed on Oct. 13, 2011, which is incorporated herein by reference. This application also claims the benefit of U.S. Provisional Patent Application Ser. No. 61/569,690, filed on Dec. 12, 2011, which is incorporated herein by reference.

BACKGROUND

Active pixel sensors (APS) are image sensors including integrated circuit containing an array of pixel sensors, each pixel containing a photodetector and an active amplifier. Such an image sensor is typically produced by a complementary metal-oxide-semiconductor (CMOS) process. CMOS APS can be used in web cams, high speed and motion capture cameras, digital radiography, endoscopy cameras, DSLRs, cell phone cameras, and the like. Other advances in image sensor technology have been implemented, such as the use of an intra-pixel charge transfer along with an in-pixel amplifier to achieve true correlated double sampling (CDS) and low temporal noise operation, and on-chip circuits for fixed-pattern noise reduction.

Many traditional CMOS imagers utilize front side illumination (FSI). In such cases, electromagnetic radiation is incident upon the semiconductor surface containing the CMOS devices and circuits. In backside illumination (BSI) CMOS imagers, on the other hand, electromagnetic radiation is incident on the semiconductor surface opposite the CMOS devices and circuits. In general, CMOS sensors are typically manufactured from silicon and can covert visible incident light into a photocurrent and ultimately into a digital image.

More generally, electromagnetic radiation can be present across a broad wavelength range, including visible range wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 to 1300 nm, a short wave infrared portion of the spectrum including wavelengths of approximately 1300 nm to 3 micrometers, and a mid to long range wave infrared (or thermal infrared) portion of the spectrum including wavelengths greater than about 3 micrometers up to about 20 micrometers. These are generally and collectively referred to herein as infrared portions of the electromagnetic spectrum unless otherwise noted.

Traditional silicon photodetecting imagers have limited light absorption/detection properties, particularly in the infrared range. In other words, such silicon based detectors are mostly transparent to infrared light. While other mostly opaque materials (e.g. InGaAs) can be used to detect infrared electromagnetic radiation having wavelengths greater that about 1000 nm, silicon is still commonly used because it is relatively cheap to manufacture and can be used to detect wavelengths in the visible spectrum (i.e. visible light, 350 nm-800 nm). Traditional silicon materials require substantial path lengths and absorption depths to detect photons having wavelengths longer than approximately 700 nm. While visible light can be absorbed at relatively shallow depths in silicon, absorption of longer wavelengths (e.g. 900 nm) in silicon of a standard wafer depth (e.g. approximately 750 µm) is poor if at all.

SUMMARY

The present disclosure provides semiconductor devices having three dimensional (3D) architectures and methods form making such devices. In one aspect, for example, a method for making a semiconductor device can include forming a device layer on a front side of a semiconductor layer, wherein the semiconductor layer is at least substantially defect free, bonding a carrier substrate to the device layer, processing the semiconductor layer on a back side opposite the device layer to form a processed surface, and coupling a bolometer to the processed surface. In some aspects, the method can also include removing the carrier substrate from the semiconductor layer to expose the device layer.

Various device layer architectures are contemplated, and any such device layer component or design is considered to be within the present scope. Non-limiting examples of forming the device layer can include CMOS circuitry, imaging devices including CMOS and CCD devices, RF circuitry, photovoltaic circuitry, and other device layer components including combinations thereof. In one specific aspect, forming the device layer further includes forming opto electronic circuitry on the front side of the semiconductor layer.

Additionally, a variety of processing techniques can be utilized to form the processed surface, and any such technique is considered to be within the present scope. For example, in one aspect, processing the semiconductor layer on the back side can include implant and/or laser anneal conditions to reduce surface defects. In another aspect, processing the semiconductor layer on the back side can include thinning the semiconductor layer from the back side to expose the device layer.

Furthermore, texturing can be performed on the device layer, the processed surface, or both the device layer and the processed surface. As such, in one aspect at least one of forming the device layer and processing the semiconductor layer includes forming a textured region thereon. In one specific aspect, forming the textured region includes texturing with a short pulse duration laser to create surface features.

In one aspect, coupling of the bolometer to the processed surface can further include depositing an etch material on the processed surface, depositing the bolometer on the etch material, and etching away at least a portion of the etch material to form a cavity between the bolometer and the processed surface.

In another aspect of the present disclosure, a semiconductor device is provided including a substantially defect-free semiconductor layer having a device layer on a front side and bolometer coupled to a processed surface on a backside of the semiconductor layer, wherein the bolometer and the processed surface are separated by a cavity, and wherein the device layer and the bolometer are functionally aligned. In one aspect, the device layer is a CMOS imager. In another aspect, at least one CMOS transistor is functionally shared with the bolometer. Furthermore, in some aspects the semiconductor device can further include a semiconductor material having a depression, wherein the semiconductor material is coupled to the backside of the semiconductor layer such that the depression is positioned to surround and form a cavity around the bolometer.

BRIEF DESCRIPTION OF THE DRAWINGS

For a fuller understanding of the nature and advantage of the present disclosure, reference is being made to the following detailed description of various embodiments and in connection with the accompanying drawings, in which.

DETAILED DESCRIPTION

Figure 1:
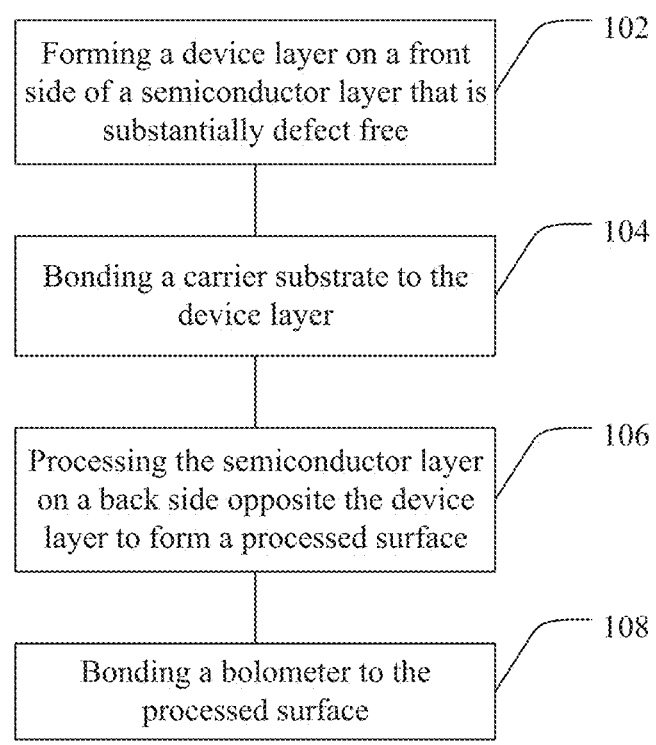
FIG. 1 is a flow diagram of a method for making a 3D architecture device in accordance with an aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the term "defect free" refers to a material having no observable crystal lattice defects. Additionally, the term "substantially defect free" refers to a material that is at least about 95% free of crystal lattice defects.

As used herein, the terms "disordered surface" and "textured surface" can be used interchangeably, and refer to a surface having a topology with nano- to micron-sized surface variations formed by the irradiation of laser pulses or other texturing methods such as chemical etching as described herein. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 2 µm to about 60 µm). In yet another aspect, the surface can include nano-sized and/or micron-sized structures from about 5 nm and about 500 µm.

As used herein, the terms "surface modifying" and "surface modification" refer to the altering of a surface of a semiconductor material to form a textured surface using a variety of surface modification techniques. Non-limiting examples of such techniques include plasma etching, reactive ion etching, porous silicon etching, lasing, chemical etching (e.g. anisotropic etching, isotropic etching), nanoimprinting, material deposition, selective epitaxial growth, and the like, including combinations thereof. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a substrate such as a semiconductor material.

As used herein, the term "substrate" can be used to refer to a material that can underlie or otherwise support a second substance. In some aspects, the second substance can be deposited thereon, while in other aspects the second substance can be formed from a portion of the substrate.

As used herein, the term "target region" refers to an area of a substrate that is intended to be doped or surface modified. The target region of the substrate can vary as the surface modifying process progresses. For example, after a first target region is doped or surface modified, a second target region may be selected on the same substrate.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "front side illumination" refers to a device architecture design whereby electromagnetic radiation is incident on a surface of a semiconductor material containing the device circuitry. In some cases a lens can be used to focus incident light onto an active absorbing region of the device while reducing the amount of light that impinges the device circuitry.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

The present disclosure provides methods for forming novel semiconductor devices having 3D architectures with low defect densities. Such methods can be utilized to produce devices, circuits, imagers, sensors, and the like, in defect-free or substantially defect-free thin 3D semiconductor structures. This can be accomplished by first forming devices, circuits, imagers, sensors, and the like (i.e. device layer) on a front side surface of a semiconductor layer, such as, for example, standard wafers used in conventional integrated circuit technology having few if any defects. The device layer of the semiconductor layer can be bonded to a carrier substrate to provide support while the backside of the semiconductor layer opposite the device layer is thinned. In some cases, processing in addition to thinning and polishing can be performed on the backside. A smart substrate can then be bonded to the processed surface of the backside of the semiconductor layer. Thus, depending on the nature of the smart substrate, such an architecture can include multiple components or devices arranged in a vertical or 3D architectural configuration that can have distinct or integrated functionality. In some cases, the carrier substrate can be removed to expose the device layer. In one aspect, all the backside thinning and processing steps, including bonding, can be performed at low temperatures. In this manner, the thin semiconductor (e.g. silicon) layer remains defect free or substantially defect free during all subsequent processing steps, at least with respect to heat-induced defects.

Accordingly, defect free or substantially defect free semiconductor substrates, layers, devices, circuits, sensors, and the like, can be coupled to smart substrates after the fabrication of these device layers. The resulting structure experiences low temperature processes after this point that will not introduce significant defects therein. Because such devices are formed on defect free semiconductor layers, the final devices are also defect free, unlike devices made from conventional process techniques where the starting substrate has a high number of defects and efforts are made to anneal out and reduce or remove these defects before forming the device layer.

In one aspect, for example, a method for making a semiconductor device is provided. Such a method can include steps, as is shown in FIG. 1, 102 forming a device layer on a front side of a semiconductor layer that is substantially defect free, 104 bonding a carrier substrate to the device layer, 106 processing the semiconductor layer on a back side opposite the device layer to form a processed surface, and 108 bonding a smart substrate such as a bolometer or microbolometer to the processed surface. In some aspects, the method can further include removing the carrier substrate from the semiconductor layer to expose the device layer.

Figure 2A:
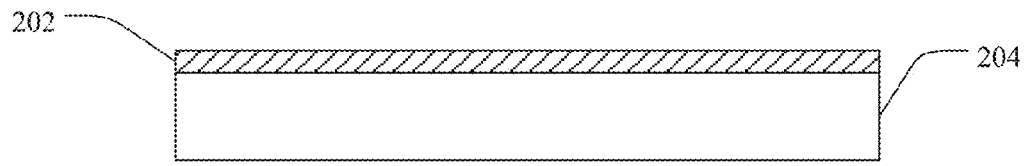
FIG. 2a shows a cross sectional view of various steps in the manufacture of a 3D architecture device in accordance with another aspect of the present disclosure.

FIGS. 2a-e show various steps in the manufacture of a 3D semiconductor structure according to one aspect of the present disclosure. As is shown in FIG. 2a, for example, device layer 202 is formed on the front side of a semiconductor layer 204. The device layer 202 can include any form of device layer that can be incorporated into a semiconductor device, and any such device is considered to be within the present scope. Non-limiting examples of device layer components can include CMOS circuitry, imaging devices, RF circuitry, photovoltaic circuitry, and the like, including combinations thereof. In one aspect, the device layer can include optoelectronic circuitry. As such, in one aspect the device layer can be an imager, such as a CMOS or a CCD imager. It is also contemplated that non-optoelectronic device layer circuitry, either in addition to or instead of optoelectronic circuitry, is within the present scope. As such, the present methods and devices should not be limited to optoelectronics.

While the semiconductor layer can be made from a variety of materials, it can be beneficial for the semiconductor to be defect free or substantially defect free. Such a defect free semiconductor layer thus allows the formation of a defect free or substantially defect free device layer thereupon. Provided defects are not introduced into the device layer from additional processing steps, the device layer can be maintained in the original defect free state. As one example, in some aspects the semiconductor device is not heated to a temperature of greater than 450° C. following the formation of the device layer.

A variety of semiconductor materials are contemplated for use as the semiconductor layer of the devices and methods according to aspects of the present disclosure. As such, any semiconductor material that can be used in a 3D semiconductor device is considered to be within the present scope. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe).

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, AlxGa1-xAs), indium gallium arsenide (InGaAs, InxGa1-xAs), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

In one specific aspect, the semiconductor layer can include silicon. In another specific aspect, the semiconductor layer can be a silicon wafer. The silicon wafer/material can be monocrystalline, multicrystalline, microcrystalline, amorphous, and the like. In one specific aspect, the silicon material can be a monocrystalline silicon wafer.

Figure 2B:
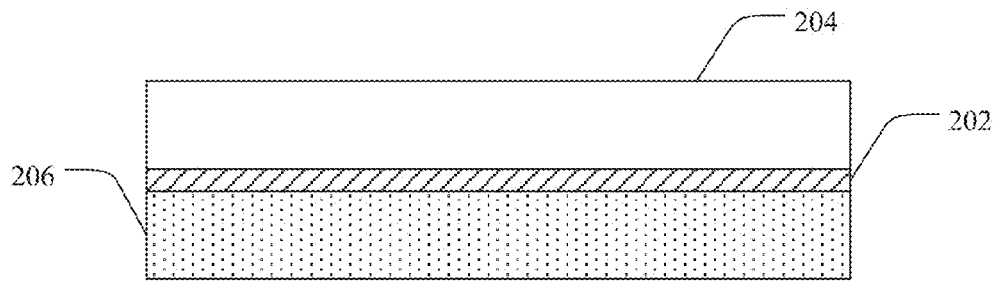
FIG. 2b shows a cross sectional view of various steps in the manufacture of a 3D architecture device in accordance with another aspect of the present disclosure.

Turning to FIG. 2b, a carrier substrate (or handle) 206 can be bonded to the device layer 202. Note that in FIG. 2b, the device has been flipped or rotated 180° as compared to FIG. 2a. The carrier substrate can include a variety of materials. Because in many aspects the carrier substrate 206 is a temporary substrate to be removed at a later processing step, the material can be chosen based on its usefulness as a temporary substrate. It can also be beneficial for the carrier substrate 206 to be capable of adequately holding the device layer 202 during processing of the semiconductor layer 204 and yet be capable of easy removal. Non-limiting examples of potential carrier substrate materials can include glass, ceramics, semiconductors, and the like, including combinations thereof.

Various bonding techniques are contemplated for attaching the carrier substrate 206 to the device layer 202, and any such bonding technique useful in making a 3D semiconductor device is considered to be within the present scope. One such process can include a liquid UV curable adhesive process that utilizes solids acrylic adhesives designed for temporary bonding of semiconductor wafers to a glass carrier substrate. This technique provides a rigid, uniform support surface that minimizes stress on the wafer during the subsequent processing steps, resulting in less warpage, cracking, edge chipping and higher yields. Other exemplary methods can include bonding and detaching a temporary carrier used for handling a wafer during the fabrication of semiconductor devices, includes bonding the wafer onto the carrier through an adhesive layer. After detaching the carrier from the wafer, the first adhesive layer remaining on the wafer is removed. In another method, bonding at low or room temperature can include surface cleaning and activation by cleaning or etching, followed by polishing the surfaces to be bonded to a high degree of smoothness and planarity. Reactive ion etching or wet etching is used to slightly etch the surfaces being bonded. The etched surfaces may be rinsed in solutions such as ammonium hydroxide or ammonium fluoride to promote the formation of desired bonding species on the surfaces.

In one aspect, for example, the bonding technique can be a low temperature technique (e.g. below 450° C.). In another aspect, the bonding can occur at room temperature or in other words, the bonding does not require a heat source. In another aspect, the device layer 202 and the carrier substrate 206 can be bonded at room temperature and a thermal treatment can be applied to consolidate the bonding interface, provided the thermal treatment is performed at a temperature that does not exceed 450° C. The parameters of the consolidation annealing can be controlled to provide a bonding energy high enough for the heterostructure to withstand post-bonding conventional process steps (e.g. CMOS processing). In one specific aspect, the bonding technique can include various oxide-oxide, oxide-silicon, or metal-metal bonding methods.

Some bonding processes can achieve a bond strength of at least 1 J/m$^2$ at room temperature. For even higher bond strengths, a bake cycle at 100°-300° C. can be utilized. Some of these oxide-oxide bonding process have been described in U.S. Pat. No. 7,871,898 and U.S. Pat. No. 5,843,832, which are incorporated by reference in their entireties. One method of direct bonding a silicon wafer onto an insulated wafer in order to obtain a 3D semiconductor device is similar to the bonding of two silicon wafers together, with the exception that before bonding a thin thermal oxide layer (e.g. about 1 micron) is grown on one of the wafers.

Release of the carrier substrate from the device layer can vary depending on the attachment process. Acrylic adhesives, for example, can be released by exposure to UV light. More permanent bonds, such as silicon-oxide bonds may require the removal of the carrier substrate by mechanical grinding and/or chemical etching to expose the device layer.

Figure 2C:
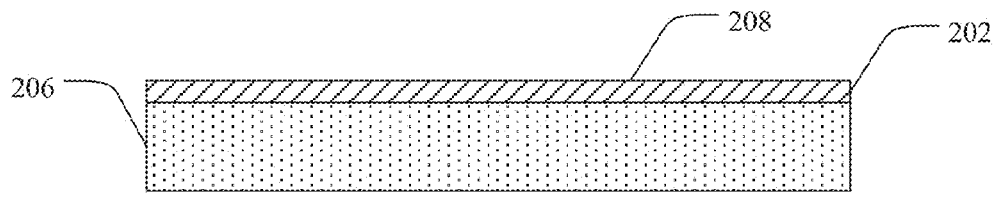
FIG. 2c shows a cross sectional view of various steps in the manufacture of a 3D architecture device in accordance with another aspect of the present disclosure.

Turning to FIG. 2c, the semiconductor layer 204 (FIG. 2b) is at least partially removed (e.g. polished and thinned) to expose the backside of the device layer 202 or, in other words, to form a processed surface 208 at the backside of the device layer 202. Thus, the resulting structure is comprised of the first substrate 206 coupled to the thin device layer 202 which, due to careful processing conditions, can remain at least substantially defect-free. At this point, any necessary or beneficial backside processing can be performed on the processed surface 208 of the device layer 202. Such beneficial backside processing can include, without limitation, texturing the back surface of device layer 202, shallow or deep trench formation, via formation, annealing, implantation, and the like. Thus, in some aspects the exposed surface of the device layer 202 (i.e. the processed surface 208) can be textured, while in other aspects the buried surface of the device layer 202 opposite the processed surface can be textured at a point in the manufacturing process when that surface is available for processing. It is also contemplated that backside circuitry can be formed at the backside surface of the device layer 202 prior to bonding the second substrate to the processed surface 208.

In one aspect, backside processing can also include exposing contact pads associated with the device layer. By opening the backside of the device layer (i.e. at the processed surface), such electrical contacts can be exposed for bonding and providing electrical contact to subsequent structures, such as the smart substrate (see below). Opening the backside can occur by any known technique, including the thinning and processing methods described. In one specific aspect, opening the backside can be accomplished via plasma etching.

Any technique useful for removing the semiconductor layer 204 is considered to be within the present scope. It can be beneficial, as has been described, for the processing temperature to not exceed 450° C. Non-limiting examples can include ion implantation/separation processes, laser ablation, laser splitting, CMP processing, dry etching, wet etching and the like, including combinations thereof. In one specific aspect, the semiconductor layer is removed by CMP techniques to expose the device layer 202.

Figure 2D:
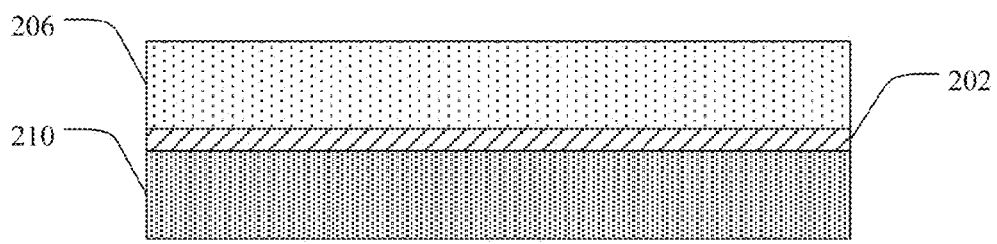
FIG. 2d shows a cross sectional view of various steps in the manufacture of a 3D architecture device in accordance with another aspect of the present disclosure.

Following removal or thinning of the semiconductor layer 204, a smart substrate 210 is bonded to the backside of the device layer 202 (i.e. the processed surface 208), as is shown in FIG. 2d. Note that in FIG. 2d, the device has been flipped or rotated by 180° compared to FIG. 2c. Any bonding technique can be utilized to bond the smart substrate 210 to the device layer 202, as was described for the bonding of the first substrate 206 to the device layer 202 (FIG. 2b), provided the process is compatible with both structures.

The smart substrate can include a variety of devices, structures, and/or materials and material configurations, depending on the desired design and subsequent properties of the 3D device. A smart substrate can include a semiconductor material having structures and/or properties that extend beyond those of a mere handle or support substrate. For example, a smart substrate can include at least one semiconductive junction. Additional non-limiting examples of smart substrates can include photodetectors, vias, bolometers, microbolometers, image sensors, CMOS circuitry, trench isolation, surface textures, and the like, including combinations thereof. In some aspects, a smart substrate can include a depression or space that will form a cavity when bonded to the device layer. Furthermore, the material utilized for the smart substrate can be selected to provide desired benefits to, or beneficial interactions with, the device layer. It is thus contemplated that, in one aspect, the smart substrate can be at least functionally integrated with the device layer. In other aspects, the smart substrate can function independently of the device layer. In further aspects, the smart substrate can be electrically coupled to, and thus can function in conjunction with, the device layer. Such electrical coupling can be accomplished by vias formed through the processed surface that connect the device layer to the smart substrate.

Figure 2E:
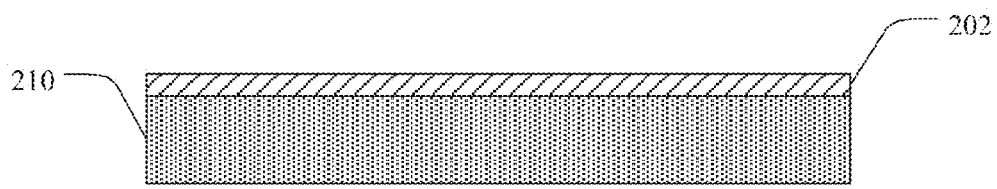
FIG. 2e shows a cross sectional view of various steps in the manufacture of a 3D architecture device in accordance with another aspect of the present disclosure.

Turning to FIG. 2e, in some aspects the carrier substrate 206 (FIG. 2d) can be removed from the device layer 202 following bonding of the smart substrate 210. Thus, the resulting 3D semiconductor structure shown in FIG. 2e includes a smart substrate 210 bonded to the device layer 202 (or in some cases a remaining portion of the semiconductor layer 204). Because of the at least substantially defect free formation of the device layer 202 on the semiconductor layer 204, and the subsequent low temperature processing of the 3D device, the device layer 202 remains defect free or substantially defect free in the final 3D device. It should be noted that the scope of the present disclosure includes the 3D device shown in FIG. 2e, as well as the intermediate structures produced during the formation of the 3D device.

In addition to the removal of the semiconductor layer, portions of the device layer can be selectively removed to expose a given structure, such as an electrical contact, a light incident surface, or some other structure that can benefit from such exposure. Such removal can be accomplished by any known technique, as has been described.

Figure 3A:
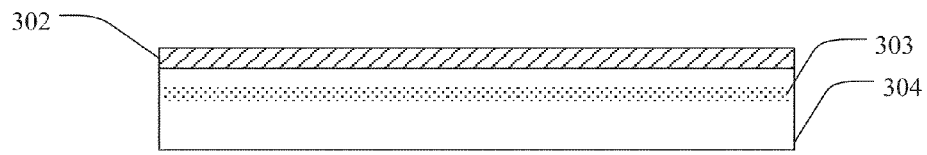
FIG. 3a shows a cross sectional view of various steps in the manufacture of a 3D architecture device in accordance with another aspect of the present disclosure.

In another aspect, FIGS. 3a-e show various steps in the manufacture of a 3D device using an embedded oxide layer to facilitate thinning. As is shown in FIG. 3a, for example, device layer 302 can formed on the front side of a semiconductor layer 304. The device layer 302 can include any form of device layer that can be incorporated into a 3D device, as has been described. A thin oxide layer 303 can be embedded within the semiconductor layer 304, either before or after the formation of the device layer 304. The thin oxide layer can be of any shape and thickness useful for the particular device design. In some aspects, however, the thin oxide layer can be from about 4000 angstroms to about 5000 angstroms thick. It is also noted that commercial SOI substrates can be used that are manufactured having such a thin oxide layer embedded.

Figure 3B:
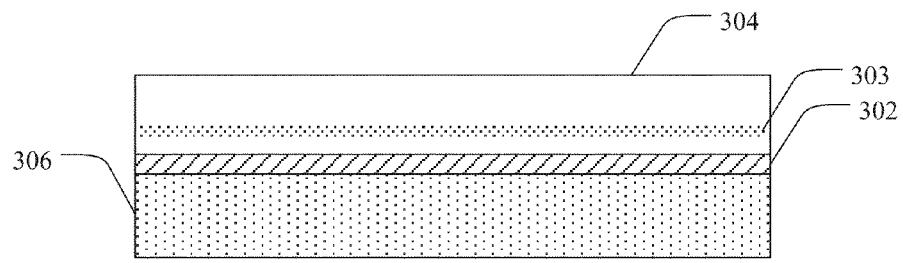
FIG. 3b shows a cross sectional view of various steps in the manufacture of a 3D architecture device in accordance with another aspect of the present disclosure.

Turning to FIG. 3b, a carrier substrate 306 can be bonded to the device layer 302. Note that in FIG. 3b, the device has been flipped or rotated 180° as compared to FIG. 3a. The carrier substrate can include a variety of materials. Because in most aspects the carrier substrate 306 is a temporary substrate to be removed at a later processing step, the material can be chosen based on its usefulness as a temporary substrate.

Figure 3C:
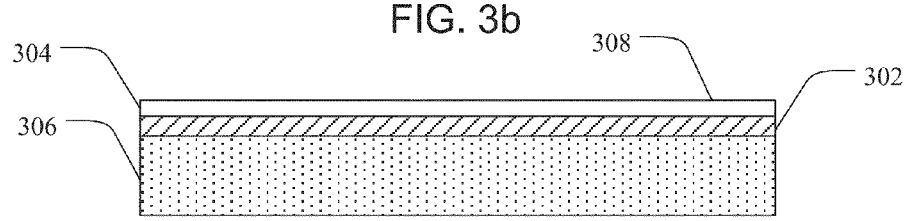
FIG. 3c shows a cross sectional view of various steps in the manufacture of a 3D architecture device in accordance with another aspect of the present disclosure.

Turning to FIG. 3c, the semiconductor layer 304 (FIG. 3b) is at least partially removed to form a processed surface 308 near the backside of the device layer 302. In one aspect, the semiconductor layer 304 can be removed at least to the thin oxide layer 303. In some aspects at least a portion of the thin oxide layer can remain, while in other aspects the thin oxide layer can be completely removed from the semiconductor layer. This material can be removed by any known method, such as, for example, laser splitting, polishing, thinning, etching, lapping or grinding, CMP processing, or a combination thereof.

Thus, the resulting structure is comprised of the carrier substrate 306 coupled to the device layer 302. A portion of the semiconductor layer 304 can remain coupled to the device layer 302 opposite the carrier substrate 306. This portion of the semiconductor layer 304 can thus be a crystallographically high quality material, and in some aspects can be lightly doped, passivated and/or laser annealed at low temperatures (e.g. below about 450° C.). At this point, any necessary or beneficial backside processing can be performed on the device layer 302. In one specific aspect, processing the semiconductor layer on the backside can include implant and/or laser anneal conditions to reduce surface defects. It is also contemplated that backside circuitry can be formed at the backside surface of the device layer 302 prior to subsequent bonding.

Figure 3D:
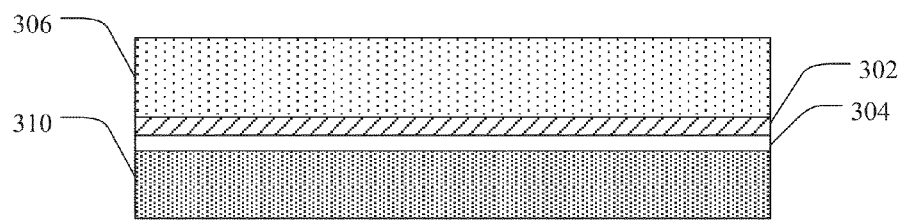
FIG. 3d shows a cross sectional view of various steps in the manufacture of a 3D architecture device in accordance with another aspect of the present disclosure.

Following thinning of the semiconductor layer 304, a smart substrate 310 can be bonded to the semiconductor layer 304 at backside of the device layer 302, as is shown in FIG. 3d. Note that in FIG. 3d, the device has been flipped or rotated 180° compared to FIG. 3c. Any bonding technique can be utilized to bond the smart substrate 310 to the semiconductor layer 304, as has been described.

Figure 3E:
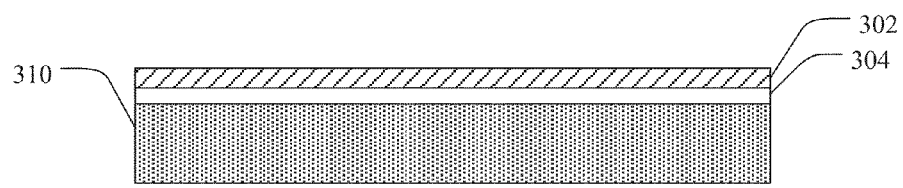
FIG. 3e shows a cross sectional view of various steps in the manufacture of a 3D architecture device in accordance with another aspect of the present disclosure.

Turning to FIG. 3e, in some aspects the carrier substrate 306 (FIG. 3d) can be removed from the device layer 302 following bonding of the smart substrate 310. Thus, the resulting 3D semiconductor structure shown in FIG. 3e includes a smart substrate 310 bonded to the semiconductor layer 304, which is bonded to the device layer 302. Because of the at least substantially defect free formation of the device layer 302 on the semiconductor layer 304, and the subsequent low temperature processing of the device, the device layer 302 remains defect free or substantially defect free in the final 3D substrate or 3D device. It should be noted that the scope of the present disclosure includes the 3D substrate shown in FIG. 3e, as well as the intermediate structures produced during the formation of the 3D substrate.

In one aspect, a 3D device can be constructed having multiple photo imagers. In one aspect, for example, such an optoelectronic device is capable of detecting multiple wavelengths in the range of from about 200 nm to about 20 microns due to the presence of multiple photo imagers. More specifically, such a device can include a first photosensitive imager capable of detecting electromagnetic radiation having a first wavelength or range of wavelengths, and a second photosensitive imager capable of detecting electromagnetic radiation having a second wavelength or range of wavelengths.

In some aspects, the first range of wavelengths and the second range of wavelengths are mutually exclusive. For example, in one aspect the first photosensitive device detects visible light, while the second photosensitive device detects infrared light. The first and second imagers can be any combination of front side illuminated and/or backside illuminated, depending on the design of the device. In another aspect, the second photosensitive device can be an infrared imager capable of detecting light having a wavelength in the range of about 600 nm to about 20 µm. It is noted that, while the present discussion relates to a first and second photosensitive imager, any number of imagers can be incorporated into a 3D architecture. As such, the present scope extends to any number of imagers and additional components in the device.

The first and the second photosensitive imagers can be 3D bonded to each other according to aspects of the present disclosure. In some cases it is contemplated that such a device architecture can utilize a more simplified optic for directing incident light on the first and second photosensitive imagers. The simplified optic can utilize at least a portion of the same optical path to direct electromagnetic radiation having a first wavelength on to the first photosensitive imager and electromagnetic radiation having a second wavelength on to the second photosensitive imager. According to one aspect, in this scenario the electromagnetic radiation having a second wavelength will have a longer wavelength that electromagnetic radiation having a first wavelength, and will thus pass through the first photosensitive imager.

As has been described, other types of infrared detectors, integrated circuits or processors, thin film detectors, etc. can be bonded to a photosensitive imager as a smart substrate. During bonding of such components on to the photosensitive imager device, device layer of the imager can be bonded to a carrier substrate, as has been described. The carrier substrate can be released following coupling of the imager (e.g. CMOS APS) to the second imager or smart substrate. As such, the smart substrate can provide both structural support and functionality that goes beyond mere support to the device. It is noted that the level of accuracy of alignment between the smart support and the device layer can depend on the complexity of the smart support, the device layer, and the degree of integration between the two. Alignment techniques utilizing fiducial markers can be employed to facilitate a proper level of integration between structures.

It is also contemplated that, in some aspects, at least a portion of the 3D structured semiconductor device can include a textured region. Such a textured region can be applied to any of the materials of the device that can be beneficial. For example, at least a portion of the device layer, the processed surface of the backside of the device layer, the smart substrate, and the like, can include a textured region. In some aspects, the textured region can be positioned on a light incident surface. In other aspects, the texture region can be positioned on a surface that is opposite a light incident surface. In yet other aspects, textured regions can be positioned at both light incident surfaces as well as surfaces that are opposite light incident surfaces. In further aspects, textured regions can be positioned along isolation features such as trench isolation in order to direct electromagnetic radiation back into the device.

The textured region can function to diffuse electromagnetic radiation, to redirect electromagnetic radiation, and/or to absorb electromagnetic radiation, thus increasing the efficiency of the device. The textured region can include surface features to thus increase the effective absorption length of the semiconductor. Such surface features can be micron-sized and/or nano-sized, and can be any shape or configurations.

Non-limiting examples of such shapes and configurations include cones, pillars, pyramids, micolenses, quantum dots, inverted features, gratings, protrusions, and the like, including combinations thereof. Additionally, factors such as manipulating the feature sizes, dimensions, material type, dopant profiles, texture location, etc. can allow the diffusing region to be tunable for a specific wavelength or wavelength range. Thus in one aspect, tuning the device can allow specific wavelengths or ranges of wavelengths to be absorbed.

Textured regions according to aspects of the present disclosure can also allow an optoelectronic device to experience multiple passes of incident electromagnetic radiation within the device, particularly at longer wavelengths (i.e. infrared). Such internal reflection increases the effective absorption length to be greater than the thickness of the semiconductor. This increase in absorption length increases the quantum efficiency of the device, leading to an improved signal to noise ratio.

The textured region can be formed by various techniques, including plasma etching, reactive ion etching, porous silicon etching, lasing, chemical etching (e.g. anisotropic etching, isotropic etching), nanoimprinting, material deposition, selective epitaxial growth, and the like. One effective method of producing a textured region is through laser processing. Such laser processing allows discrete locations of the passivation region or other substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection. The laser treated region can be associated with the surface nearest the impinging electromagnetic radiation or, in some cases, the laser treated surface can be associated with a surface opposite in relation to impinging electromagnetic radiation, thereby allowing the radiation to pass through the semiconductor before it hits the laser treated region.

In one aspect, for example, a target region of a semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a substrate material is irradiated with laser radiation to form a textured or surface modified region.

The type of laser radiation used to surface modify a material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds. In another aspect, laser pulse widths are in the range of from about 10 femtoseconds to about 500 picoseconds.

The number of laser pulses irradiating a target region can be in a range of from about 1 to about 2000. In one aspect, the number of laser pulses irradiating a target region can be from about 2 to about 1000. Further, the repetition rate or frequency of the pulses can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

Figure 4:
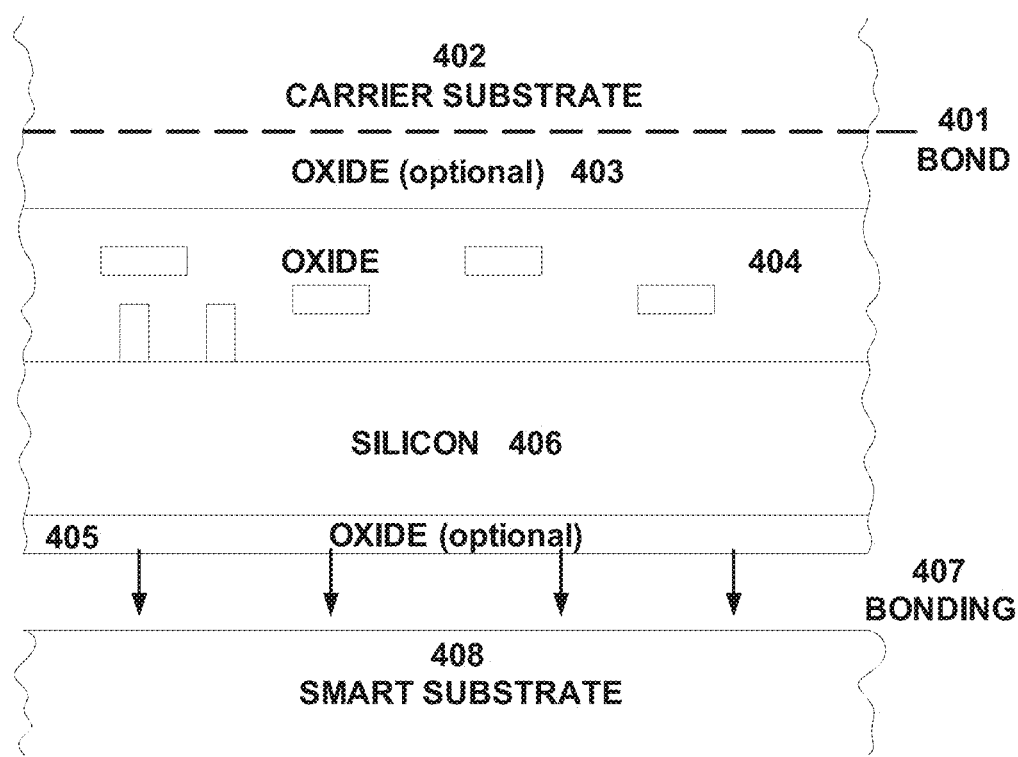
FIG. 4 shows a 3D architecture bonding technique in accordance with another aspect of the present disclosure.

In one specific aspect, as is shown in FIG. 4, a structure having a thin or ultra-thin silicon device and circuit wafer with front side oxide and wiring 404, is provided. The structure is bonded to a smart substrate 408. The front side bonding of the completed integrated circuit wafer 406 can be by an oxide-oxide bond, an oxide-silicon bond, an oxide-adhesive bond, a metal-metal bond, or the like 401, to the carrier substrate 402. In one aspect, an oxide 403 can be utilized for bonding. The backside of the integrated circuit wafer 406 can be thinned and an oxide 405 can be deposited thereupon for use in an oxide-oxide bond or a silicon-oxide bond 407 to the smart substrate 408. During these steps there is minimal damage to the device and circuit wafer that under goes only low temperature heat cycles.

In some aspects, at least one isolation feature can be formed at a beneficial location with respect to the 3D structure. In one non-limiting aspect, for example, an isolation feature can be positioned between adjacent photosensitive imager devices to provide optical and/or electrical isolation therebetween. In some aspects, the isolation feature can be a shallow or deep trench isolation feature. Isolation features can also be positioned/configured to reflect incident electromagnetic radiation back into the device to facilitate absorption. As has also been described, in some examples regions of the isolation feature can include a textured region to further facilitate reflection and absorption, thereby increasing the effective absorption length of the device. In other aspects, the sides of isolation features can be doped. In some aspects, a doped isolation feature can form an electrical surface field, similar to an electrical back surface field. The isolation features can be formed at any point in the manufacturing process when the appropriate material layer is exposed for processing.

Figure 5A:
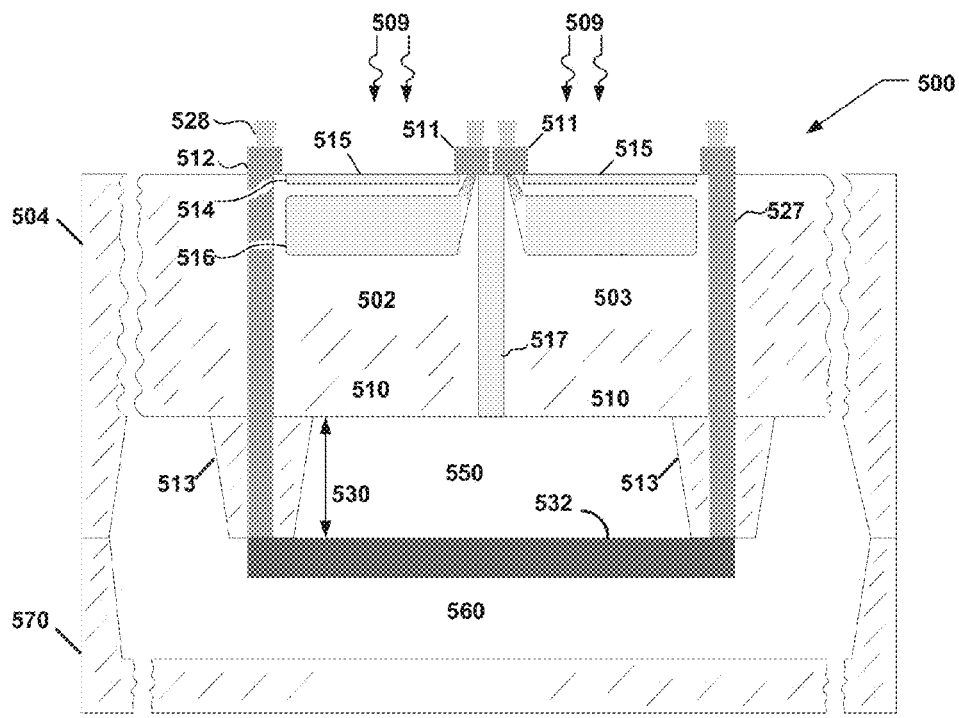
FIG. 5a is a cross-sectional schematic view of a CMOS APS with far infrared bolometer detector attached to the backside according to one embodiment of the present disclosure.

In another aspect, as is shown in FIG. 5a, CMOS active pixel visible 502 and near infrared imagers 503 and a bolometer type thermal or far infrared imager 532 can be integrated into a single silicon integrated circuit wafer or die, 500. It is noted that the terms bolometer and microbolometer can be used interchangably for the purposes of the present disclosure. FIG. 5a shows a first cavity 550 and second cavity 560 etched within the device 500. The first cavity 550 is etched in to the backside (or a first photosensitive imaging device) to a predetermined depth 530, and the second cavity 560 is etched to have larger dimensions than the first cavity 550. The cavities are used to at least partially enclose a microbolometer 532. The microbolometer 532 is supported by pillars 513 formed within the cavity 550 on the back of the CMOS imager wafer 504. The imager pixels 502 can be isolated from each other by an isolation region 517 and the two wafers (device wafer 504, smart substrate 570) can be joined by silicon-silicon bonding or other appropriate techniques, depending on the position of the bolometer and the overall design of the device. The imager pixels 502, 503 can be conventional structures capable of detecting electromagnetic radiation having a first wavelength (i.e. visible light) and can include a p-type region 510, an n-type diode region 516, a p-type pinning layer 514, and transfer device and other transistors 511. The details of the transfer device and readout circuit, or four transistor sense circuit are not shown in FIG. 5a. Electromagnetic radiation 509 is incident on a light incident surface 515. A thermal or far infrared microbolometer 532 is positioned on the back of a thinned silicon wafer and connected to the associated readout circuits, in this case a direct injection sensor circuit is coupled by through silicon vias 527. The read out integrated circuit 512 on the front surface is connected to wiring by electrical contacts 528.

Electromagnetic radiation 509 is incident at the light incident surface 515 of the pixels. Short wavelength visible radiation will be strongly absorbed near the surface of the pinned photodiode including the P+ surface layer, a buried N-type diode, on the p-type silicon substrate. The microbolometer type thermal or far infrared detector 532 has been placed and spaced away from the backside of the silicon substrate 510, allowing for a proper design of the thermal time constant of the microbolometer type detector whose temperature is increased by radiation from the scene in the field of view.

Figure 5B:
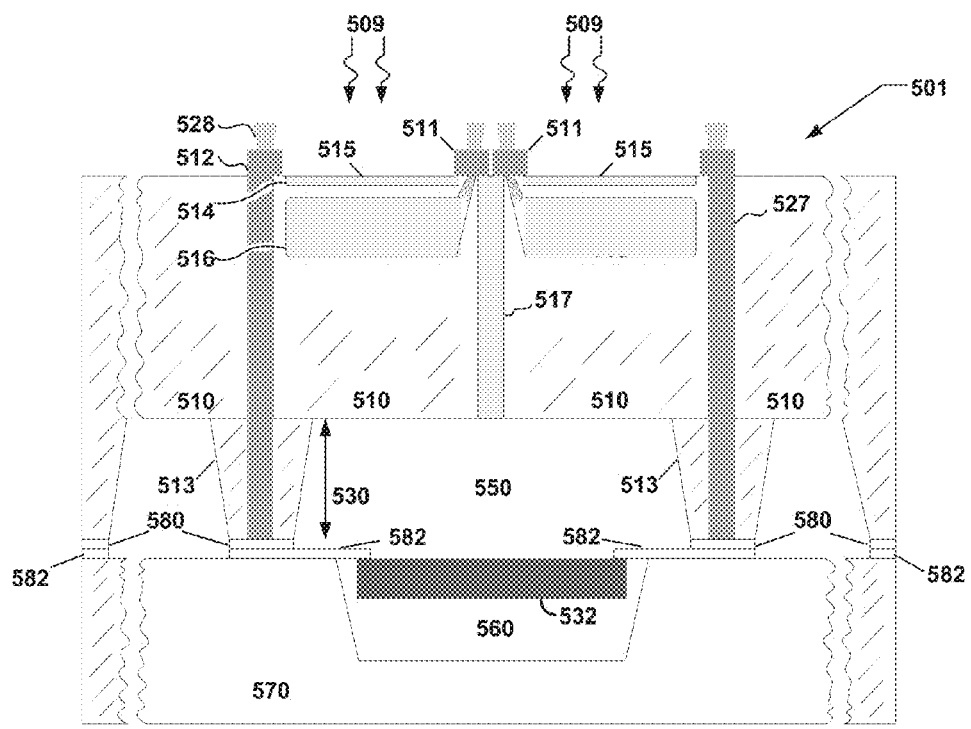
FIG. 5b is a cross-sectional schematic view of a CMOS APS with far infrared bolometer detector attached to a bonded backside carrier wafer according to one embodiment of the present disclosure.

FIG. 5b shows 501 CMOS active pixel visible and near infrared imagers with microbolometer type thermal or far infrared detector 532 on a smart substrate 570. The smart substrate 570 is bonded to a silicon CMOS APS wafer 510. A cavity 560 can be formed in the smart wafer 570 to coincide with the position of the microbolometer. The metal wiring on the back of the CMOS APS imager wafer 580 and wiring on the front of the smart wafer 582 form the metal to metal bond joining the wafers. All other number designations in FIG. 5b have the same designations and meanings as those in FIG. 5a.

Figure 6A:
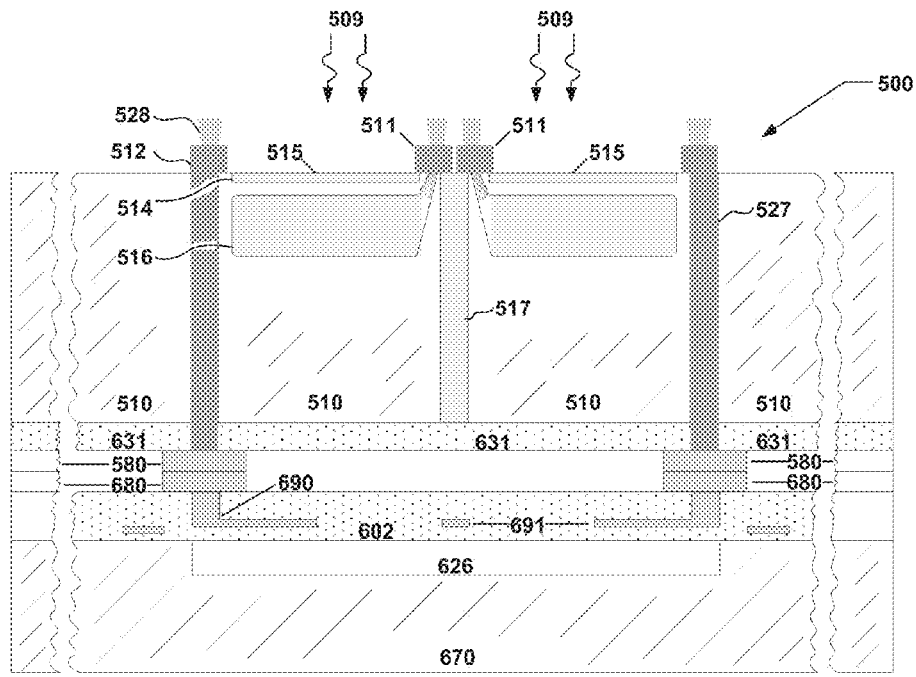
FIG. 6a is a cross-sectional schematic view of an infrared detecting photodiode on a bonded wafer attached to the backside of a CMOS APS imager according to one embodiment of the present disclosure.

Other types of infrared detectors, intergrated circuits or processors, and thin film detectors, bonded to the back of a visible imager are contemplated herein. FIG. 6a, for example, illustrates a system 600 including a photodiode or other infrared detector 626 on a smart substrate 670 that can be bonded to a metal containing material 580 over an insulator layer 631 on the backside of the CMOS APS imager. Metallization 680 can be on the smart substrate 670. Wiring 691 in dielectric interconnection insulation 602 is connected to front side metallization 680 on the smart substrate 670 by vias 690. Components that have the same numbers as used in previous figures have the same description.

Figure 6B:
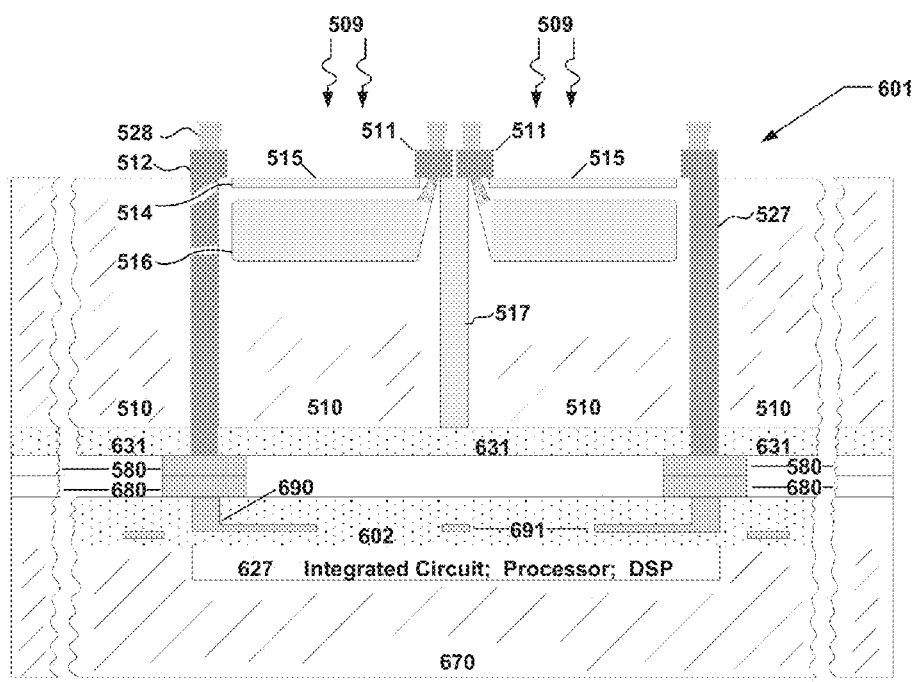
FIG. 6b is a cross-sectional schematic view of an integrated circuit, processor or digital signal processing circuit on a bonded wafer attached to the backside of a CMOS APS imager according to yet another embodiment of the present disclosure.

FIG. 6b illustrates a system 601 including an integrated circuit 627 on a smart substrate 670 that can be bonded to a metal containing material 580 over an insulator layer 631 on the backside of the CMOS APS imager. Metallization 680 can be on the smart substrate 670. Wiring 691 in dielectric interconnection insulation 602 is connected to front side metallization 680 on the smart substrate 670 by vias 690. Components that have the same numbers as used in previous figures have the same description.

Figure 7A:
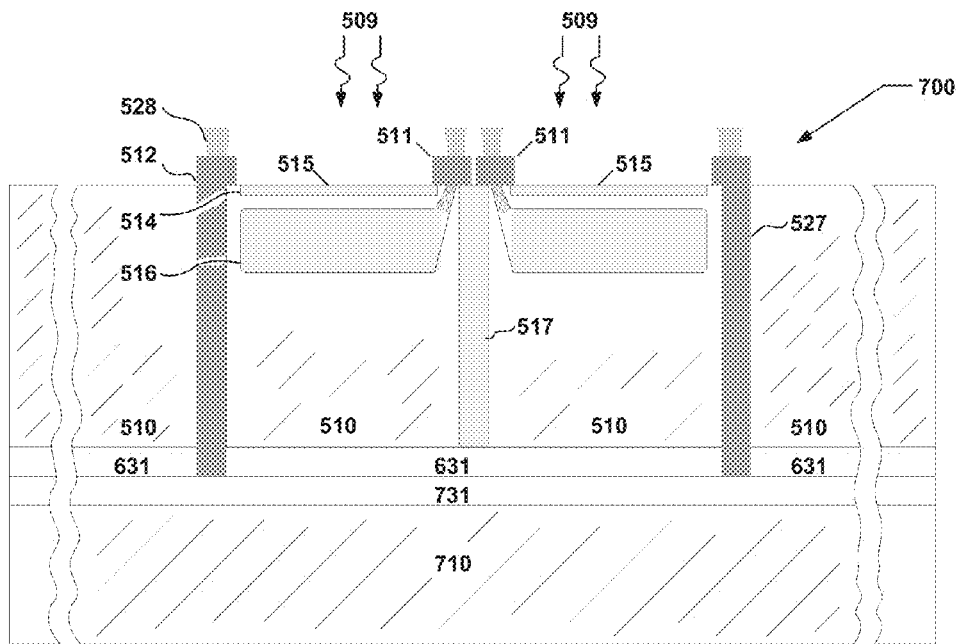
FIG. 7a is a cross-sectional schematic view of a thin film compound semiconductor layer with photo-detecting devices attached to the backside of a CMOS APS imager according to another embodiment of the present disclosure.

In another aspect, FIG. 7a shows an additional dielectric layer 631 can be placed on the back of the CMOS APS imager. The combined system 700 consists of a CMOS APS imager with a thin film of III-V semiconductor layers 710 containing photodiodes or other detectors bonded by layer 731 containing of low temperature metal-metal bonds. Semiconductor layers 710 can be epitaxial liftoff layers fabricated by the techniques known to those skilled in the art. Known methods can allow for layers to be formed at higher temperatures but later bonded to silicon wafers at low temperatures. Post pattern processing can then be used to define the individual photodetectors. Components that have the same numbers as used in previous figures have the same description.

Figure 7B:
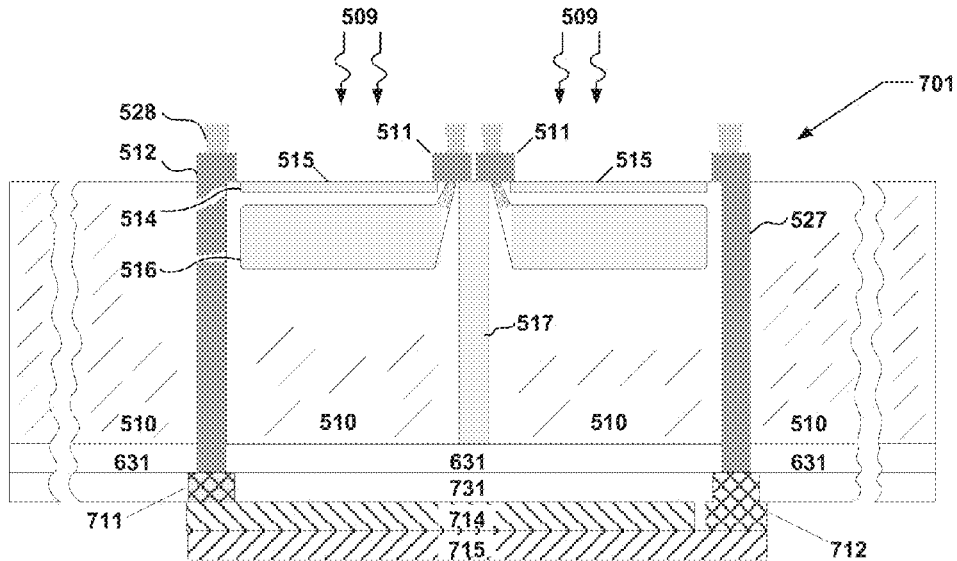
FIG. 7b is a cross-sectional schematic view of a compound semiconductor photo-detecting device attached to the backside of a CMOS APS imager wired and connected to through-silicon vias according to one embodiment of the present disclosure.

In FIG. 7b, III-V semiconductor photodetectors bonded on to the back of a CMOS APS imager form an integrated detection system 701. The photodetectors are shown here as p-n junction diodes with doped layers 714 and 715. These layers can be patterned by photolithography and electrically connected to the through silicon vias (TSVs) 527 in the imager by wiring and vias 711 and 712. All of this patterning and wiring can be low temperature processes compatible with the already formed CMOS APS imagers. Components that have the same numbers as used in previous figures have the same description.

Figure 8A:
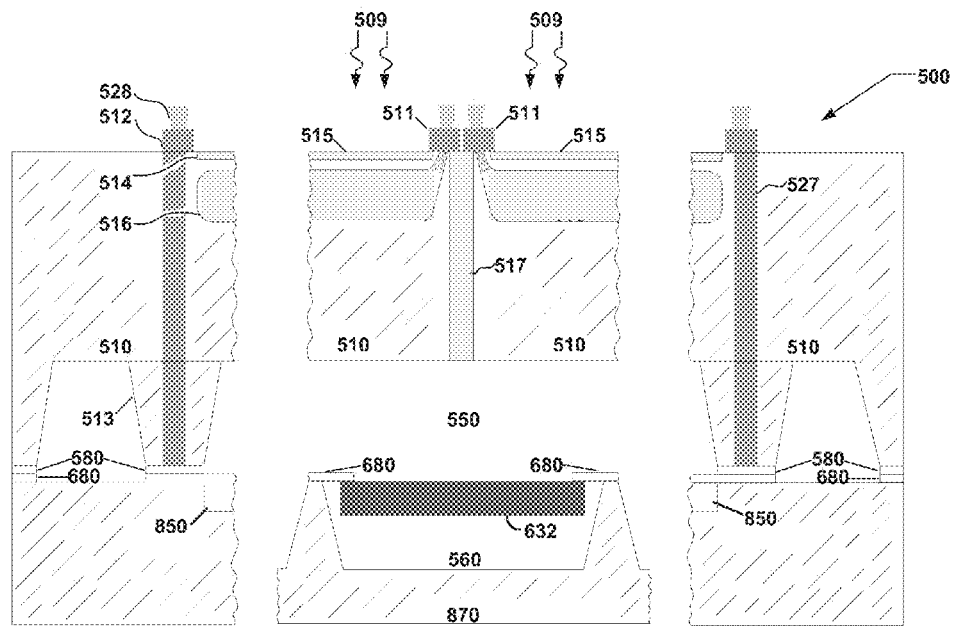
FIG. 8a is a cross-sectional schematic view of an infrared imaging array with bolometer type photodetectors and integrated circuits attached to the backside of a CMOS APS imager and wired and connected by through-silicon vias according to one embodiment of the present disclosure.
Figure 8B:
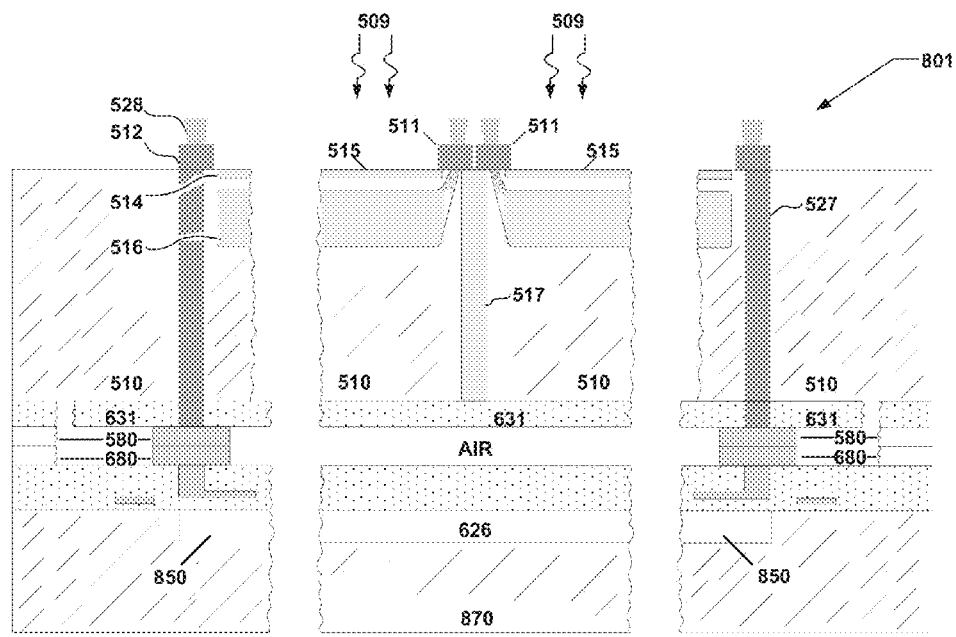
FIG. 8b is a cross-sectional view of an infrared imaging array with photodiode detectors and integrated circuits attached to the backside of a CMOS APS imager and wired and connected by through-silicon vias according to one embodiment of the present disclosure.

In another aspect, a CMOS APS imager having at least one via per pixel and TSVs to individually connect each pixel on the bonded side of the carrier wafer to front side circuitry on the silicon CMOS APS imager is provided. This aspect allows for the use of fewer TSVs. FIG. 8a-b shows two embodiments where a smart substrate 870 includes photodetectors, integrated circuitry 850 and TSVs at the edges of the arrays on the smart substrate 870. Components that have the same numbers as used in previous figures have the same description.

FIG. 8a shows one aspect of an electromagnetic sensing system 800 including a bolometer type imaging array bonded to the back of a CMOS visible imager. In FIG. 8a the smart substrate 870 has integrated bolometer detectors 632 and circuitry 850. The integrated circuitry 850 allows address decoding and signal processing on the smart substrate of the far infrared image signals, which are transferred to the front side of the CMOS visible imager wafer at the edges of the array by vias 527. Components that have the same numbers as used in previous figures have the same description.

In another aspect, shown in FIG. 8b, an electromagnetic sensing system 801 including a narrow bandgap compound semiconductor infrared detecting photodiode type imaging array bonded to the back of a CMOS visible imager. In FIG. 8b the smart substrate 870 has integrated photodetectors 626 and circuitry 850. The integrated circuitry 850 allows address decoding and signal processing on the carrier wafer of the infrared image signals, which are transferred to the front side of the CMOS visible imager wafer at the edges of the array by vias 527. In this case the smart substrate 870 might, for example, be an InGaAs near infrared imaging array on an InP substrate. Integrated circuit devices and transistors can be fabricated in the InP substrate and smart substrate 870. Components that have the same numbers as used in previous figures have the same description.

Further details regarding backside texturing of CMOS APS and wafer bonding can be found in U.S. patent application Ser. No. 12/885,158 filed Sep. 17, 2010, which is incorporated by reference herein in its entirety.

Figure 9:
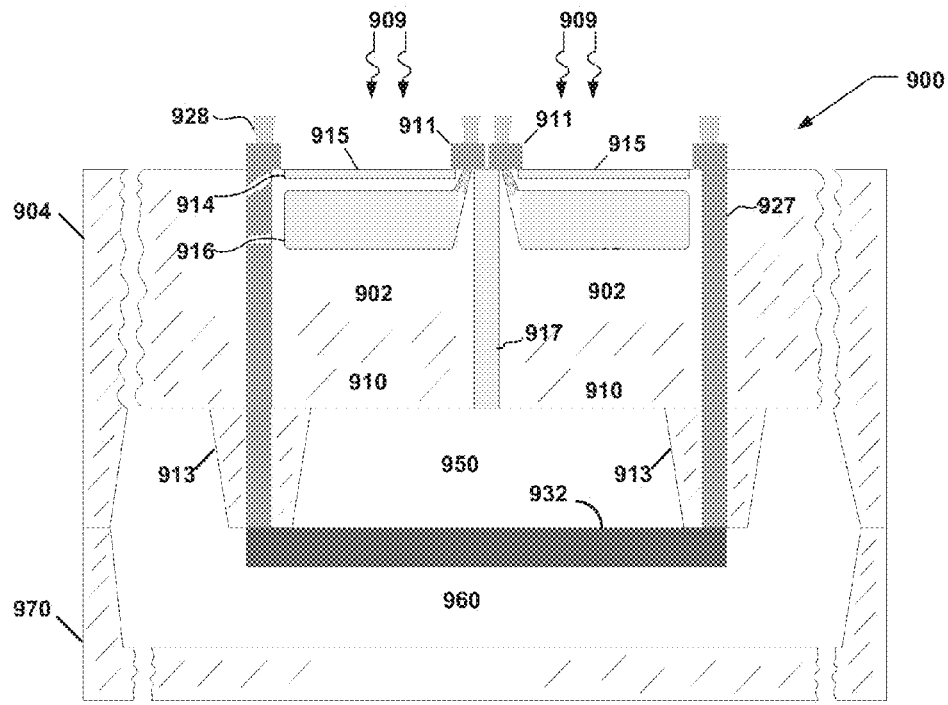
FIG. 9 is a cross-sectional schematic view of a CMOS APS with far infrared bolometer detector attached to the backside according to one embodiment of the present disclosure.

In another aspect of the present disclosure, as is shown in FIG. 9, a device integrating CMOS APS visible and/or near infrared imagers 902 with bolometer type thermal or far infrared imager 932 into one silicon integrated circuit wafer or die similar to that shown in FIGS. 5a and 5b is provided. Notably, FIG. 9 shows a first cavity 950 and second cavity 960 etched within the device 900. In some cases the second cavity 960 can have greater internal dimensions as compared to the first cavity 950. The bolometer or microbolometer 932 is supported by pillars 913 formed within the cavity 950 on the back of the CMOS imager wafer 904. The imager pixels 902 can be isolated from each other by an isolation region 917 and the two wafers (device wafer 904, smart substrate or wafer 970) can be joined by a variety of techniques. One such technique can be accomplished as follows, which should not be seen as limiting.

In some cases, the bolometer can be deposited, either directly or indirectly, onto the processed surface of the device, depending on the device and manufacturing design. For example, in one aspect an etch material can be deposited onto a portion of the processed surface, followed by deposition of the bolometer material (e.g. amorphous silicon). If posts are to be used to couple to the semiconductor layer and thus support the bolometer, then post material can be deposited in the appropriate regions. Thus, the bolometer is deposited over the etch material and is continuous with the post material that extends through the etch material to contact the processed surface, or at least a structurally stable portion of the device. Following bolometer deposition, the etch material can be etched away to form a cavity between the bolometer and the processed surface (see FIG. 9). In some aspects, it may be beneficial to protect the processed surface from the etchant. For example, a passivation or etch stop layer can be applied to the processed layer prior to deposition to provide such protection. Such protective measures can be either removed following etching or left to remain in the device.

Furthermore, in some aspects a semiconductor material 970 having a depression therein can be coupled to the backside of the semiconductor layer 904. The depression can thus form a cavity 960 around the bolometer 932. It is noted that cavities 950 and 960 can be separate or continuous, and they can be sealed from the air outside of the device, or they can be open to air outside of the device. Additionally, one or more of the cavities can be filled with an inert gas, a vacuum, or a material beneficial to the manufacture or use of the bolometer or the device.

The imager pixels 902 can be structures capable of detecting visible light, they can be structures capable of detecting infrared light, or they can be a combination thereof. Furthermore, the imager pixels 902 can include a p-type region 910, an n-type diode region 916, a p-type pinning layer 914, and transfer device and other transistors 911. The details of the transfer device and readout circuit, or four transistor sense circuit are not shown in FIG. 9. Electromagnetic radiation 909 is incident on a light incident surface 915. A thermal or far infrared bolometer or microbolometer 932 is positioned on the back of a thinned silicon wafer and connected to the associated readout circuits, in this case a direct injection sensor circuit is coupled by through silicon vias 927. The read out integrated circuit 912 on the front surface is connected to wiring by vias 928.

Short wavelength visible radiation will be strongly absorbed near the surface of the pinned photodiode including the P+ surface layer, a buried N-type diode, on the p-type silicon substrate. The microbolometer type thermal or far infrared detector 932 can be positioned and spaced away from the backside of the silicon substrate 910, allowing for a proper design of the thermal time constant of the microbolometer type detector whose temperature is increased by radiation from the scene in the field of view. A long wavelength pass filter that absorbs and/or reflects any visible and near infrared radiation can be used to minimize crosstalk between the imagers that might result from temperature changes in the bolometer. A metal reflector can be associated with the carrier wafer 170 or the cavity 960 to reflect radiation that has passed through the bolometer back toward the imagers. A mechanical driven germanium or other filter can also be used in front of the CMOS imager when operated as a far infrared or a thermal imager.

Figure 10:
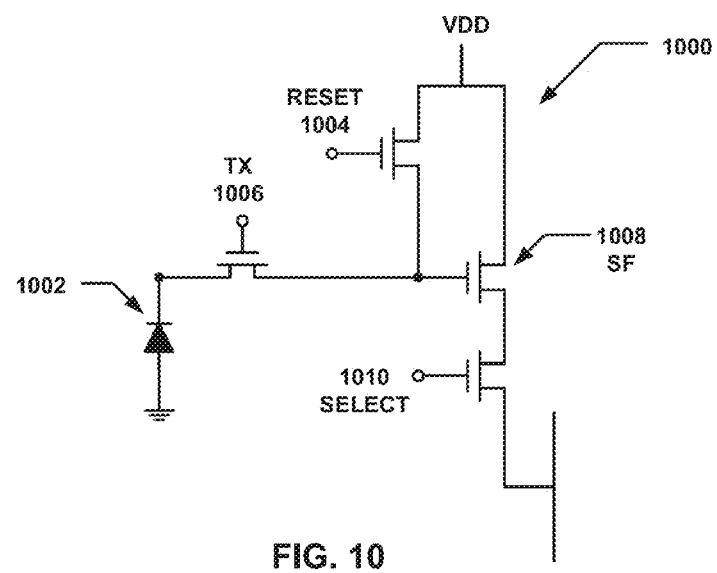
FIG. 10 is an exemplary circuit schematic for a four-transistor (4-T) architecture according to one embodiment of the present disclosure.

FIG. 10 shows an exemplary schematic for a four-transistor (4-T) architecture 1000, which can be used in the detectors of a CMOS active pixel sensor. The pixel can include a photodiode 1002, a reset 1004, a transfer gate 1006, a source follower transistor 1008, and a row select transistor 1010. The voltage or potential on photodiode 1002 can be set or reset by a reset transistor 1004.

Figure 11:
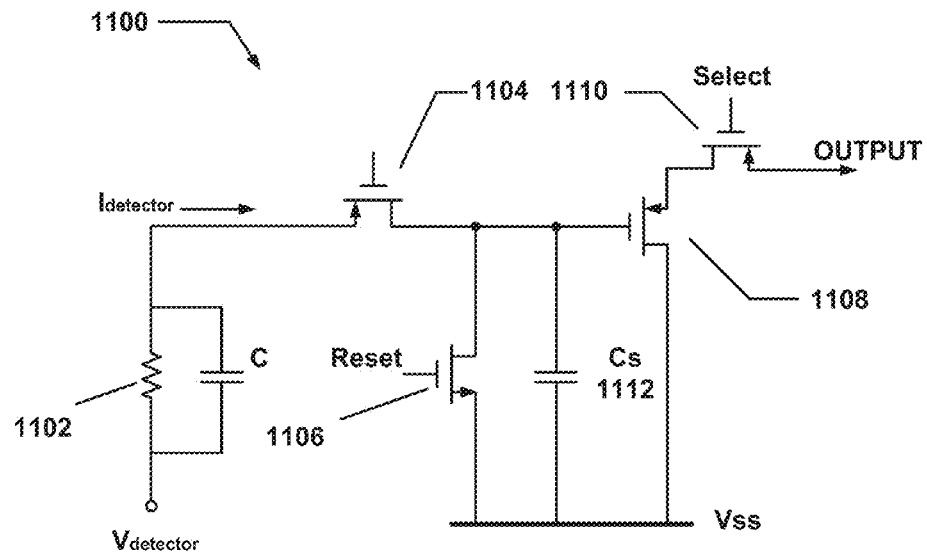
FIG. 11 is an exemplary circuit schematic for a direct injection readout architecture according to one embodiment of the present disclosure.

One example of a direct injection read out circuit 1100 shown in FIG. 11 can be used to sense the temperature change in bolometer type detectors. A bolometer or microbolometer is shown at 1102. Transistor 1104 can be a common gate transistor, transistor 1106 can be a reset transistor, transistor 1108 can be a source follower, and transistor 1110 can be a select transistor. DC current from the bolometer 1102 can be integrated on the capacitor 1112 connected to the gate of the source follower transistor 1108 and produces a voltage on the gate of transistor 1108.

In another aspect, an optical element can be coupled to the imaging device for focusing incident radiation onto one or more imagers. Typically with thermal detecting bolometers, a silicon or germanium window or lens is used; however, these types of materials tend to absorb visible and near infrared radiation and in some cases may not be effective in the present design. Wide bandgap-type material that is less prone to absorb visible or far infrared radiation can be more effectively used as a lens and/or window in some cases. Non-limiting examples can include ZnS, $BaF_2$, and the like. In addition, ZnO and cryolite dichroic interference filters, for example, can also be beneficially used.

Figure 12:
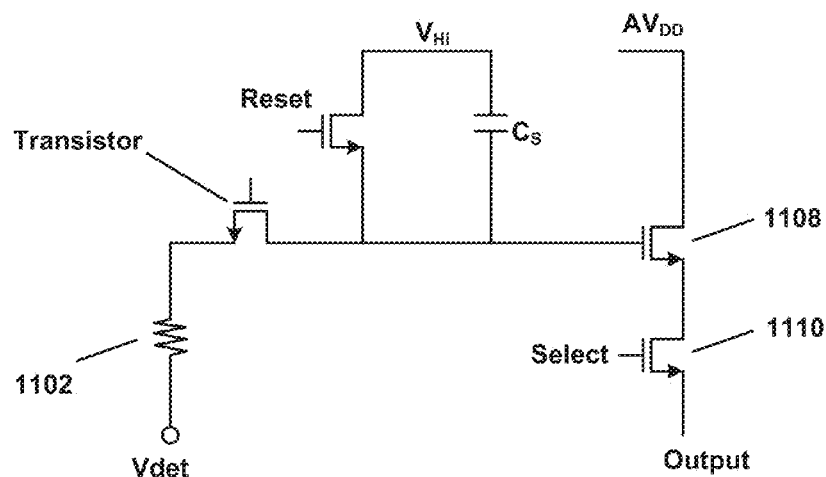
FIG. 12 is an exemplary circuit schematic for a direct injection readout architecture according to one embodiment of the present disclosure.

Other variations of the devices shown herein are included within the present scope that may provide a benefit. For example, it can be useful from a manufacturing as well as an efficiency perspective to eliminate at least one via from the device (e.g. FIG. 9, via 927). Various techniques are contemplated for accomplishing this via reduction, and any such technique is considered to be within the present scope. One exemplary circuit diagram is shown in FIG. 12. Note that the same callout numbers in FIGS. 11 and 12 represent the same or similar components, and as such the descriptions apply across figure numbering. By making the Vdetector node in FIG. 11 a global node associated with the cavity 960 (FIG. 9), as one example, one through-wafer via and one vertical route can be eliminated for each 4-pixel cell in a visible image sensor. As such, a metal or other electrically conductive material can be deposited into the cavity 960 for use as a global node. Additionally, in another aspect, the direct injection circuit of FIG. 11 can be reconfigured to connect the bottom node of capacitor Cs to Vdd instead of Vss. This may eliminate a Vss connection and vertical route in a 4-pixel cell, and would also allow the direct injection source follower 1108 and row select devices 1110 to be NMOS instead of PMOS. In this way, the column readout circuitry can be identical or substantially similar for both the visible image sensor and the bolometer. $V_{Hi}$, represents the higher operating voltage of the bolometer. In some aspects, $V_{Hi}$, can be connected to $AV_{DD}$.

Figure 13:
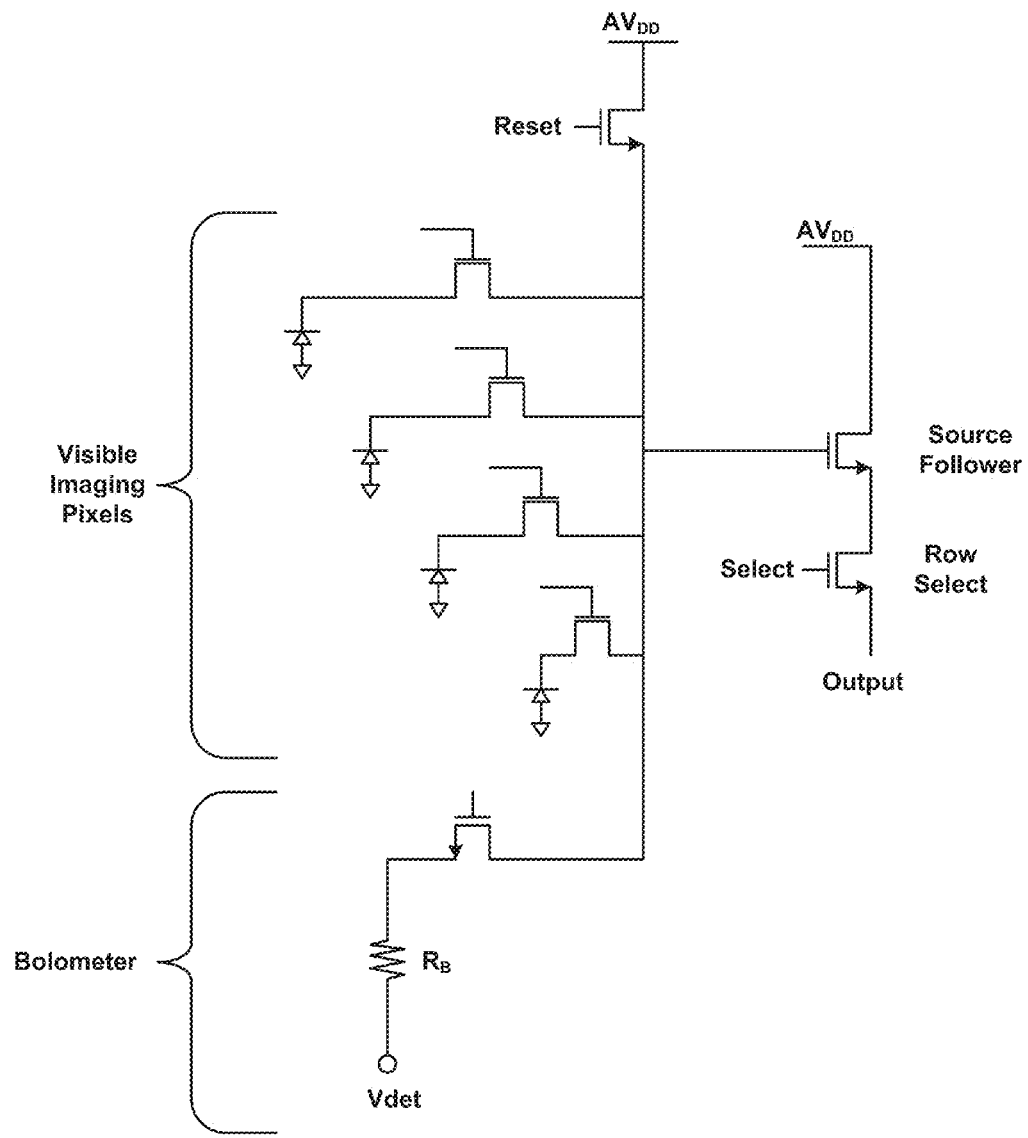
FIG. 13 is an exemplary circuit schematic for a direct injection readout architecture according to one embodiment of the present disclosure.

In a further aspect, if a 4-way shared architecture is used for the visible image sensor pixel, and the direct injection circuit is reconfigured to connect the bottom node of capacitor Cs to Vdd instead of Vss as in FIG. 12, then the bolometer pixel can share the pixel reset, source-follower, and/or row select devices with one or more of the visible imaging pixels as is shown in FIG. 13. This and similar approaches can greatly simplify pixel layout, reduce the number of horizontal and vertical routes, and yield maximum fill factor for both the bolometer pixel and the 4-cell visible image pixel. The visible pixel floating diffusion can serve as the direct injection circuit sampling capacitor, Cs. Additionally, it is noted that the bolometer can share one or more transistor, two or more transistors, three or more transistors, or four or more transistors with the CMOS or other imaging device.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method for making a semiconductor device, comprising:
    forming a device layer on a front side of a semiconductor layer, wherein the semiconductor layer is at least substantially defect free;
    bonding a carrier substrate to the device layer;
    processing the semiconductor layer on a back side opposite the device layer to form a processed surface; and
    coupling a bolometer to the processed surface.

2. The method of claim 1, further comprising removing the carrier substrate to expose the device layer.

3. The method of claim 1, wherein processing the semiconductor layer on the back side to form the processed surface further includes exposing contact pads associated with the device layer.

4. The method of claim 1, wherein forming the device layer further includes forming optoelectronic circuitry on the front side of the semiconductor layer.

5. The method of claim 1, wherein forming the device layer further includes forming on the front side of the semiconductor layer a member selected from the group consisting of CMOS circuitry, imaging devices, RF circuitry, photovoltaic circuitry, or a combination thereof.

6. The method of claim 1, wherein forming the device layer further includes forming a CMOS imager.

7. The method of claim 1, wherein the semiconductor layer includes a silicon material.

8. The method of claim 7, wherein the silicon material is a single crystal silicon wafer.

9. The method of claim 1, wherein processing the semiconductor layer on the back side further includes thinning the semiconductor layer from the back side to expose the device layer.

10. The method of claim 9, wherein processing the semiconductor layer on the back side further includes implant and/or laser anneal conditions to reduce surface defects.

11. The method of claim 1, wherein at least one of forming the device layer and processing the semiconductor layer includes forming a textured region thereon.

12. The method of claim 11, wherein forming the textured region includes texturing with a short pulse duration laser to create surface features.

13. The method of claim 1, further comprising forming at least one shallow or deep trench isolation in the processed surface prior to coupling the bolometer to the processed surface.

14. The method of claim 1, further comprising forming at least one via in the processed surface prior to coupling the bolometer to the processed surface.

15. The method of claim 1, further comprising forming backside circuitry at the processed surface prior to coupling the bolometer to the processed surface.

16. The method of claim 1, wherein the coupling of the bolometer to the processed surface further includes:
    depositing an etch material on the processed surface;
    depositing the bolometer on the etch material; and
    etching away at least a portion of the etch material to form a cavity between the bolometer and the processed surface.

17. The method of claim 1, wherein the semiconductor device is not heated above a temperature of 450° C. following processing of the back side to form the processed surface.

18. A semiconductor device made according to claim 1.

19. A semiconductor device, comprising:
    a substantially defect-free semiconductor layer having a device layer on a front side and bolometer coupled to a processed surface on a backside of the semiconductor layer, wherein the bolometer and the processed surface are separated by a cavity, and wherein the device layer and the bolometer are functionally aligned.

20. The device of claim 19, wherein the device layer is a CMOS imager.

21. The device of claim 20, wherein at least one CMOS transistor is functionally shared with the bolometer.

22. The device of claim 19, further comprising a semiconductor material having a depression and being coupled to the backside of the semiconductor layer, the depression being positioned to surround and form a cavity around the bolometer.

23. The device of claim 19, wherein the device layer includes optoelectronic circuitry.

24. The device of claim 19, wherein the device layer includes a member selected from the group consisting of CMOS circuitry, RF circuitry, photovoltaic circuitry, or a combination thereof.

25. The device of claim 19, wherein the semiconductor layer includes a silicon material.

26. The device of claim 25, wherein the silicon material is a single crystal silicon wafer.

27. The device of claim 19, further comprising at least one trench in the processed surface.

28. The device of claim 19, further comprising at least one via in the processed surface electrically coupling at least a portion of the device layer to at least a portion of the bolometer.

* * * * *